United States Patent [19]

Madoff

[11] 4,068,199
[45] Jan. 10, 1978

[54] DIGITAL PHASE-LOCKED LOOP FREQUENCY MODULATOR

[75] Inventor: Herbert S. Madoff, Sudbury, Mass.

[73] Assignee: GTE Sylvania Incorporated, Stamford, Conn.

[21] Appl. No.: 753,799

[22] Filed: Dec. 23, 1976

[51] Int. Cl.² .............................................. H03C 3/00
[52] U.S. Cl. ...................................... 332/19; 325/148; 325/184; 331/25
[58] Field of Search ....................... 332/9 R, 16 R, 19; 325/143, 148, 184; 331/1 A, 18, 23, 25

[56] References Cited

U.S. PATENT DOCUMENTS

| 3,551,826 | 12/1970 | Sepe | 331/1 A X |
| 3,805,192 | 4/1974 | Ocnaschek et al. | 332/16 R |
| 3,864,637 | 2/1975 | Kanow | 331/18 X |

Primary Examiner—Siegfried H. Grimm
Attorney, Agent, or Firm—David M. Keay; Norman J. O'Malley; Peter Xiarhos

[57] ABSTRACT

Frequency modulating apparatus employing a phase-locked loop. An analog signal is sampled periodically and each sample is converted to a digital signal by an analog-to-digital converter. A constant is added to the digital signal and the sum is employed as the divisor of a programmable divider connected in the phase-locked loop between the output of the voltage controlled oscillator and an input of a phase detector. The output of the voltage controlled oscillator is also divided by an output divider and then filtered to provide a sinusoidal output signal. The resulting output signal is at a center frequency which is frequency modulated by the analog signal.

4 Claims, 1 Drawing Figure

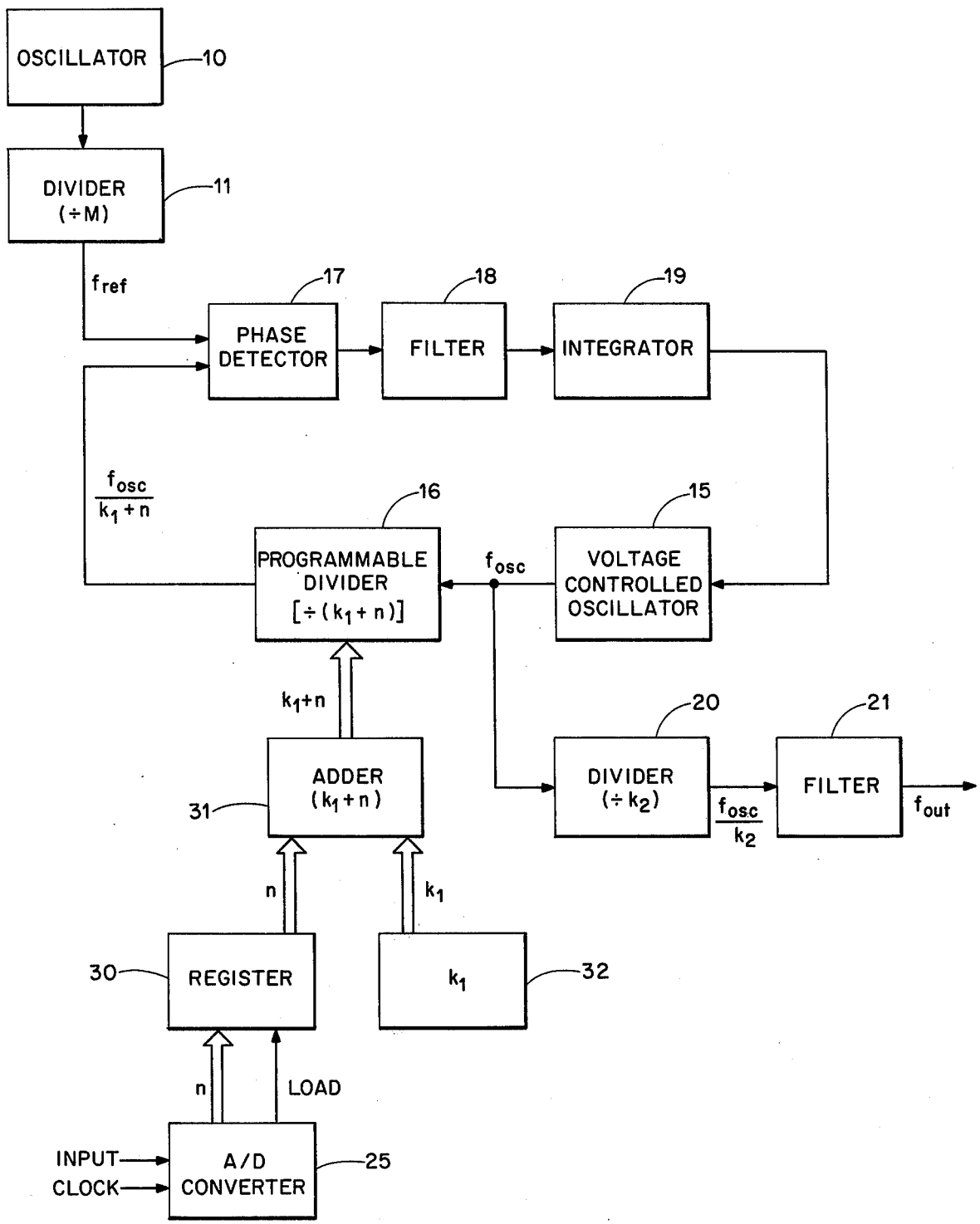

DIGITAL PHASE-LOCKED LOOP FREQUENCY MODULATOR

BACKGROUND OF THE INVENTION

This invention relates to communication apparatus. More particularly, it is concerned with apparatus for producing a frequency modulated (FM) signal.

Communication systems utilizing frequency modulated carrier signals are well-known. Apparatus employed in such systems for frequency modulating a carrier signal with an analog signal are also well-known. Apparatus of this type which is stable and reliable is relatively complicated and expensive.

SUMMARY OF THE INVENTION

Relatively simple frequency modulating apparatus which is stable and reliable is provided by modulation apparatus in accordance with the present invention. This apparatus includes a means for producing a reference frequency signal and a voltage controlled oscillator. A dividing means divides the frequency of the output signal from the voltage controlled oscillator by a divisor. A phase detector means has a first input which is coupled to the means for producing the reference frequency signal, a second input which is coupled to the output of the dividing means, and an output which is coupled to the input of the voltage controlled oscillator. The foregoing combination of elements provides a phase-locked loop in which the frequency of the output signal from the voltage controlled oscillator is equal to the frequency of the reference frequency signal multiplied by the divisor. The apparatus also includes signal input means which receives an input signal and applies a divisor representing the input signal to the dividing means. Thus, the frequency of the output signal from the voltage controlled oscillator is modulated by the input signal being received.

BRIEF DESCRIPTION OF THE DRAWINGS

Additional objects, features, and advantages of modulating apparatus in accordance with the present invention will be apparent from the following detailed discussion together with the accompanying drawing wherein the single figure is a schematic block diagram of frequency modulating apparatus in accordance with the present invention.

DETAILED DESCRIPTION OF THE INVENTION

The single FIGURE of the drawing illustrates frequency modulating apparatus in accordance with the present invention.

The apparatus includes an oscillator 10 which may be a highly stable temperature-compensated crystal oscillator. A divider 11 divides the oscillator output frequency by a divisor M to provide a reference frequency signal $f_{ref}$. The reference frequency signal $f_{ref}$ is applied to a phase-locked loop which employs a voltage controlled oscillator 15. A voltage controlled oscillator is a well-known device which produces an output frequency signal related to its input voltage. The output $f_{osc}$ of the voltage controlled oscillator is applied to a programmable divider 16 which divides the frequency of the oscillator output by a divosor $(k_1+n)$.

The phase-locked loop also includes a phase detector 17 which has a first input connected to the divider 11 in order to receive the reference frequency signal $f_{ref}$, and has a second input connected to the programmable divider 16 in order to receive the oscillator frequency divided by the divisor $f_{osc}/(k_1+n)$. The output of the phase detector 17 is passed through low pass filter 18 and an integrator 19 to provide a DC voltage to the voltage controlled oscillator 15. the phase-locked loop operates in a conventional manner with the phase detector 17 producing an error voltage related to the phase and frequency difference between its input signals. The error voltage is appropriately filtered and integrated and applied to the voltage controlled oscillator 15 causing the output of the voltage controlled oscillator 15 to be equal to the reference frequency multiplied by the divisor applied to the programmable divider 16. That is, $f_{osc}=(k_1+n)f_{ref}$.

The output $f_{osc}$ of the voltage controlled oscillator 15 is also applied to an output divider 20 which divides the oscillator frequency signal by a divisor $k_2$. The resulting frequency $f_{osc}/k_2$ is passed through a narrow band filter 21 to provide a sinusoidal output signal $f_{out}$. This signal may be appropriately translated upward in frequency to a desired carrier frequency in the RF range for transmission over suitable transmission media.

The analog signal for FM modulating the output signal frequency $f_{out}$ is applied as the INPUT signal to an analog-to-digital converter 25. The analog-to-digital converter 25 is clocked to sample the incoming INPUT signal by a suitable CLOCK signal, for example, at a 50 KHz rate. The analog-to-digital converter 25 is of a conventional well-known type which samples the analog INPUT signal once during each CLOCK interval and produces a digital signal n representing the analog sample. The analog-to-digital converter 25 produces a LOAD pulse when the conversion process is complete and a digital representation n of the sampled INPUT signal is present at the output.

The output n from the analog-to-digital converter 25 is applied to a register 30. The register is clocked to load the digital signal n by the LOAD pulse from the analog-to-digital converter. The contents n of the register are applied to an adder 31. The adder also receives a digital signal $k_1$ from a source 32. The value of $k_1$ is constant for any particular set of operating conditions of the apparatus. The adder 31 adds the constant $k_1$ to the digital representation n of the sampled analog INPUT signal.

The digital sum of $k_1+n$ is applied to the programmable divider 16 by the adder 31 as the divisor. The programmable divider is a counter which counts downward from the value of the divisor $(k_1+n)$ which is placed therein on the pulses from the output $f_{osc}$ of the voltage controlled oscillator 15. When the count is reduced to all zeros, an output pulse which is at the frequency $f_{osc}/(k_1+n)$ is produced to the phase detector 17. The digital signal $k_1+n$ from the adder 31 is loaded into the programmable divider 16 on the output pulse to initiate the next countdown sequence. The value $(k_1+n)$ of the divisor changes when a new sample of the INPUT signal has been taken; that is, at the 50 KHz CLOCK rate. Since the frequency of the output of the voltage controlled oscillator $f_{osc}$ is much greater than the 50 KHz CLOCK pulses which sample the INPUT signal, each value of $k_1+n$ is loaded into the divider several times.

As explained previously the output signal $f_{osc}$ from the voltage controlled oscillator 15 is divided by the divisor $k_1+n$ by the programmable divider 16 and applied to the phase detector 17. By virtue of the operation of the phase-locked loop the output signal from the voltage controlled oscillator changes so that it is equal to the reference frequency multiplied by the divisor; that is, $f_{osc}=(k_1+n)f_{ref}$. The output of the voltage controlled oscillator is divided by the output divider 20 so that $f_{out}=((k_1+n)/k_2)f_{ref}$. When there is no INPUT signal present ($n=0$) the output signal $f_{out}$ is at the center frequency $f_c$. Therefore, $f_c=(k_1/k_2)f_{ref}$. The output frequency is $(f_{out}=f_c + f_m$ and $+ f_m = (n/k_2)f_{ref})$.

In a specific embodiment of the apparatus an analog INPUT signal at audio frequencies was sampled by CLOCK pulses at a 50 KHz rate. The analog-to-digital converter 25 converted each sample to a 5-bit digital signal $n$. Thus, the maximum value of $n$ was + 16. The output frequency of the oscillator 10 was 1.28 MHz. The divider 11 divided this frequency by a divisor M of 10 to produce a reference frequency signal $f_{ref}$ of 128 KHz. The values of $k_1$ and $k_2$ were 400 and 256, respectively. The resulting center frequency of the voltage controlled oscillator was 51.2 MHz and the center frequency $f_c$ of the output signal $f_{out}$ was 200 KHz. In accordance with $+ f_m=(n/k_2)f_{ref}$ the instantaneous deviation $f_m$ was proportional to $n$ which may have any integer value between ± 16 depending upon the sampled INPUT signal. The maximum modulation frequency of the output signal was ± 8 KHz.

In order to operate the apparatus in a different mode with the same center frequency $f_c$ of 200 KHz but with a modulation rate of ± 5 KHz the divisor M of the divider 11 was changed to 16 and the divisor $k_2$ of the output divider 20 was changed to 640. The resulting reference frequency signal $f_{ref}$ was 80 KHz and the center frequency of the voltage controlled oscillator 15 was 51.2 MHz.

The output signal $f_{osc}$ from the voltage controlled oscillator 15 is a frequency modulated squarewave. This signal is passed through the narrow band filter 21 to provide a frequency modulated sinewave $f_{out}$. The frequency modulated signal is translated upward into the RF range for transmission at the desired carrier frequency.

The frequency modulating apparatus as described hereinabove is relatively simple and uncomplicated. For example, the only oscillator required in addition to the voltage controlled oscillator is the primary oscillator for generating the reference frequency. The apparatus employs individual devices and components of straightforward conventional design. Stability is obtained by the inherent operating characteristics of phase-locked loops. Precise control of frequency deviation is obtained by the use of fixed digital values which control the operations of the components throughout the system. In addition the operating mode of the apparatus is flexible both as to the center frequency $f_c$ of the output signal and the modulation frequency $f_m$ as long as the operating ranges of the components, particularly the voltage controlled oscillator, are not exceeded.

While there has been shown and described what is considered a preferred embodiment of the present invention, it will be obvious to those skilled in the art that various changes and modifications may be made therein without departing from the invention as defined by the appended claims.

What is claimed is

1. Frequency modulating apparatus including in combination
   means for producing a reference frequency signal;
   a voltage controlled oscillator;
   programmable dividing means coupled to the output of the voltage controlled oscillator for dividing the frequency of the output signal from the voltage controlled oscillator by a divisor;
   phase detector means having a first input coupled to said means for producing a reference frequency signal, a second input coupled to the output of said programmable dividing means, and an output coupled to the input of the voltage controlled oscillator to produce a phase-locked loop in which the frequency of the output signal from the voltage controlled oscillator is equal to the frequency of the reference frequency signal multiplied by said divisor;
   signal converting means for receiving an input signal and for converting the input signal to digital signals;
   storage means coupled to said signal converting means for holding a digital signal therefrom; and
   divisor means coupled to said storage means and to said programmable dividing means for applying to said programmable dividing means a divisor representing the digital signal held by said storage means, whereby the frequency of the output signal from the voltage controlled oscillator is modulated by the input signal being received.

2. Frequency modulating apparatus in accordance with claim 1 wherein
   said signal converting means is operable to receive a continuous analog input signal and to convert the analog input signal to a series of digital signals;
   said storage means is operable to hold each digital signal from the signal converting means for a sample period; and
   said divisor means is operable to convert the digital signal held in said storage means to a divisor and to apply the divisor to said programmable dividing means.

3. Frequency modulating apparatus in accordance with claim 2 wherein said divisor means includes
   a source of a constant digital signal; and
   adding means coupled to said storage means, to said source of a constant digital signal, and to said programmable dividing means; said adding means being operable to add the constant digital signal from said source to the digital signal held in said storage means to produce the divisor being applied to the programmable dividing means.

4. Frequency modulating apparatus in accordance with claim 3 including
   output dividing means coupled to said voltage controlled oscillator for dividing the frequency of the output signal from the voltage controlled oscillator by a fixed amount.

* * * * *